United States Patent [19]

Butsch et al.

[11] Patent Number: 5,798,528

[45] Date of Patent: Aug. 25, 1998

[54] CORRECTION OF PATTERN DEPENDENT POSITION ERRORS IN ELECTRON BEAM LITHOGRAPHY

[75] Inventors: Rainer Butsch, Fairport; John George Hartley, Fishkill, both of N.Y.; Werner Stickel, Ridgefield, Conn.

[73] Assignee: International Business Machines Corporation, Armonk, N.Y.

[21] Appl. No.: 814,211

[22] Filed: Mar. 11, 1997

[51] Int. Cl.$^6$ .................................................. H01J 37/304
[52] U.S. Cl. ........................................ 250/492.2; 250/398
[58] Field of Search ........................... 250/398, 492.2, 250/491.1

[56] References Cited

U.S. PATENT DOCUMENTS

| | | | |
|---|---|---|---|
| 3,555,347 | 1/1971 | Dickinson | 315/18 |
| 3,644,700 | 2/1972 | Kruppa | 219/121 EB |
| 4,016,396 | 4/1977 | Hassan et al. | 219/121 EB |
| 4,321,510 | 3/1982 | Takigawa | 315/382 |
| 4,430,571 | 2/1984 | Smith et al. | 250/492.2 |
| 4,442,361 | 4/1984 | Zasio et al. | 250/492.2 |
| 4,467,170 | 8/1984 | Hata et al. | 219/121 EH |
| 4,467,211 | 8/1984 | Smith et al. | 250/492.2 |
| 4,677,296 | 6/1987 | Lischke et al. | 250/396 R |
| 4,728,799 | 3/1988 | Gordon et al. | 250/492.2 |
| 5,043,586 | 8/1991 | Giuffre et al. | 250/492.2 |
| 5,105,089 | 4/1992 | Yamada | 250/492.2 |
| 5,171,964 | 12/1992 | Booke et al. | 219/121.19 |
| 5,304,441 | 4/1994 | Samuels et al. | 430/30 |
| 5,329,090 | 7/1994 | Woelki et al. | 219/121.68 |
| 5,345,085 | 9/1994 | Prior | 250/492.22 |
| 5,422,491 | 6/1995 | Sakamoto | 250/491.1 |
| 5,424,548 | 6/1995 | Puisto | 250/491.1 |
| 5,432,314 | 7/1995 | Yamazaki et al. | 250/492.2 |

FOREIGN PATENT DOCUMENTS

| | | |
|---|---|---|
| 56-48136(A) | 5/1981 | Japan . |
| 56-76532(A) | 6/1981 | Japan . |
| 59-208827(A) | 11/1984 | Japan . |
| 62-86718(A) | 4/1987 | Japan . |

OTHER PUBLICATIONS

Electron–Beam, X–Ray, EUV, and Ion–Beam Submicrometer Lithographies for Manufacturing V, Proceedings Reprint, SPIE–The International Society for Optical Engineering, 20–21 Feb. 1995, Santa Clara, California, vol. 2437, pp. 160–167.

Electron Beam Lithography Tool for Manufacture of X–Ray Masks, IBM Journal of Research and Development, by T.R. Groves, J.G. Hartley, H.C. Pfeiffer, D.Puisto, D.K. Bailey, vol. 37, No. 3, May 1993, pp. 411–419.

Progress in E–Beam Mask Making for Optical and X–Ray Lithography, by Hans C. Pfeiffer and Timothy R. Groves, Microelectronics Engineering vol. 13, No. 1–4, Mar. 1991, pp. 141–150.

*Primary Examiner*—Bruce Anderson
*Attorney, Agent, or Firm*—DeLio & Peterson, LLC; John J. Tomaszewski; Eric W. Petraske

[57] ABSTRACT

A method is disclosed for improving the electron beam apparatus lithography process wherein the calibration procedure for the apparatus is improved by using the product pattern and stepping sequence used to make the mask on a calibration plate and/or calibration grid and to determine improved apparatus correction errors which errors are used to control the apparatus for making an improved mask. The well-known EMULATION procedure is improved by calculating additional field correction errors based on a two step registration procedure to determine X/Y apparatus stepping errors. The LEARN procedure based on a static calibration grid procedure is improved by employing the duty cycle of the product pattern to calibrate the apparatus to determine deflection beam errors.

21 Claims, 8 Drawing Sheets

CORRECTION OF PATTERN DEPENDENT POSITION ERRORS IN ELECTRON BEAM LITHOGRAPHY

BACKGROUND OF THE INVENTION

1. Field of the Invention

This invention relates to electron beam (E-beam) lithography used in semiconductor manufacturing. More particularly it relates to a technique for minimizing errors due to movement of the X-Y stepping stage and to magnetic and electrostatic forces used in controlling an E-beam to improve the E-beam writing process or mask fabrication process.

2. Description of Related Art

Polymeric materials, such as photoresists, are widely used in the semiconductor industry to produce masks of all types. In mask making the photoresist is overlaid on a surface in which the desired image is to be formed, exposed to the desired image and developed so that the image formed in the photoresist can be replicated in the underlying surface. To achieve the extremely fine details in the resulting replicated image on the underlying surface, necessary to X-ray masks, the photoresist is exposed by electron beams (E-beams).

FIG. 1 illustrates an X-ray mask which can be improved by the present invention. The general process used to fabricate such X-ray masks is well known. In general, the process requires a substrate 10 consisting of a typically 2.5 micron thick membrane region 11, etched into a boron doped silicon wafer 12, 100 mm in diameter, bonded to a dielectric support ring 13. This assembly forms a mask blank. Alignment windows can be created, in the blank, by coating the entire surface of the blank with polyimide 15 and etching the silicon away from the areas where the alignment windows 14 are to be created. Although only a single alignment window 14 is shown, as many as is desirable can be made in the mask. Once the alignment windows are formed, the polyimide is removed from the central membrane area but left in the area over the alignment windows. The entire blank surface, including the polyimide layer, is then coated with thin layers of chrome and gold (not shown) as a plating base for later processing and overcoated with approximately 8000 Angstroms of an E-beam reactive photoresist (not shown).

The photoresist layer on the blank is then exposed in an E-beam lithography system after which the photoresist is developed to form openings (not shown) therein. A heavy layer of gold, which serves as an absorber, is then electroplated into the openings formed in the photoresist by the developing step. The photoresist and any exposed chrome and gold plating base layers, not covered by the electroplated gold, is usually now stripped from the blank surface leaving the gold absorber deposits 16 and 17 on the silicon and polyimide surfaces as shown in FIG. 1. This forms an X-ray mask which may now be used to expose a photoresist layer on a semiconductor wafer.

In the production of such masks extreme accuracy is required, for any errors or distortions appearing in the mask will result in the same errors or distortions being replicated in the final products. The present invention sets forth a method of and apparatus for creating masks having enhanced accuracy.

Suitable electron beam lithographic apparatus are also well known, widely used and readily available in the semiconductor industry. In general this apparatus, schematically shown in FIG. 2, has an electron beam source 18 that generates a beam of electrons which can be deflected in the X and Y directions by a series of electromagnetic and electrostatic deflection plates and coils 19 and 20. These plates and coils can be readily controlled by a computer 21 through an electron beam controller 22. By controlling the plates and coils the beam 23 is caused to scan a limited region 24 on the workpiece 25 on which it is impinging. To bring new regions under the beam, the workpiece is generally mounted on a suitable stepping stage 26, movable in the X-Y directions.

When using an E-beam apparatus to fabricate masks many things can cause distortions in the images produced. Correction of such distortions is especially necessary when X-ray masks are to be produced. For example, mechanical and electrical considerations of the E-beam apparatus used can cause distortions due to effects such as stage translational errors, magnification, drift, mirror distortion, and column charging. In X-ray masks other distortions, such as stress induced errors, often occur due to the process used to deposit the gold absorber material or to remove the photoresist. Still other distortions, such as localized heating during exposure and charging of the resist itself can occur due to interaction characteristics of the electrons in the beam and the photoresist. These distortions can be pattern dependent due to the shape and layout of the pattern being created in the photoresist. Since any of these distortions appearing in the mask used to produce the final product will be replicated in the final product it is desirable that the mask be created with as few distortions as possible. It is therefore important that correction or compensation be provided for as many of the above described distortions as is possible.

As the ground rules for lithographic devices and masks continue to shrink, overlay detractors that were formerly tolerable begin to consume a significant share of an ever decreasing error budget. In advanced electron beam based, probe-forming lithography tools, the pattern image which is stored in a computer system, is ultimately transferred to a substrate (which may be a silicon wafer, a glass or X-ray mask, and which is coated with an electron beam sensitive resist).

The pattern data is broken down into field sized units with a field defined by the range of electronic beam positioning on the substrate. The fields contain subfields and the subfields contain product design rectangular areas defined below, which areas are built from spots formed by the electron beam as is well-known in the art. A program is used to direct the X/Y stage to the desired location and then actual pattern exposure begins. Referring to FIGS. 10A, 10B and 10C, the pattern is first decomposed into rectilinear elements or spots 52 as shown in FIG. 10C, which, in variable shaped beam (VSB) systems, correspond to the probe (beam spot) size and shape. Thus, in FIG. 10A, fields 30 are divided into subfields 50. The subfields as shown in FIG. 10B, have the design of the product pattern in the form of rectangles 51. The rectangles 51 are formed from recitilinear elements 52 as shown in FIG. 10C. The pattern elements, and therefore the data describing the elements (i.e., size, position, exposure time, and other control information), then are transferred serially to the substrate. The distribution-in-time of the data, hereafter referred to as 'duty cycle', is, of course, unique for each pattern transferred. Duty cycle may be defined as the charge dose and dose dwell time needed to form the pattern data format in the form of rectangles with the rectilinear elements 52 and the movement of the beam used to form the rectangles which are exposed in the desired pattern in each field and subfield to form the product pattern.

Electron beam lithography systems are in general sensitive to variations of this duty cycle in the sense that the placement accuracy of the pattern elements is affected. The most common causes are charge accumulation in the surroundings of the beam, and temperature changes in the beam control devices. Both affect the stability of the system and consequently the predictability of beam positioning on the substrate and the correction of E-beam induced errors is now performed using known E-beam apparatus calibration techniques.

The calibration errors may be grouped into two categories, distinguished by the terms 'linear' and 'non-linear'. Linear errors are those, where all points in the interior of the field covered by the beam on the substrate by the positioning devices (referred to from here on as 'deflection field'), are displaced in proportion to the distance from the axes of a reference coordinate system. These errors include translation and rotation (shift and mis-orientation of the entire field as a rigid body with respect to the reference system), as well as anisotropic magnification and orthogonality of the field (size and shape difference to the nominal field).

Non-linear errors are those where the relative positions of points in the deflection field, after removal of the linear errors, are described by higher order polynomials. There are numerous such errors possible. Examples are the (to the opticist) familiar pincushion and barrel-shaped distortions, which are generated by lenses.

There exist a class of repeatable linear errors which must be removed with every exposure. The errors are generally due to non-orthogonality of the X/Y stage mirrors and mis-alignment of the field calibration grid with respect to the interferometer axis. The first error is strictly a function of the stage X/Y coordinates, while the second is static. In both cases the needed corrections are now determined by exposing a sparse "L" pattern on a substrate over the normal limits of the writing area. Measurement and analysis of this sparse "L" pattern provides the data necessary to correct such X/Y stage errors and overall field distortions.

The EMULATION procedure is used to correct repeatable stage errors and a mask substrate is written with measurement targets covering the entire writing area on each field of the substrate as shown in FIG. 4.

In general, the apparatus is first calibrated for its stage stepping characteristics and for overall field distortions. This is accomplished by creating a plurality of equally sized fields 30 on a photoresist coated sacrificial substrate or workpiece 31 as shown in FIG. 3. A selected pattern of L-shaped alignment marks 32 is then written across each field 30, as shown in FIG. 4 which is an enlarged view of one such field 30. Once all the alignment marks are written into the photoresist, the photoresist is developed and the actual position of the central L-shaped image 32a, in each field, is measured with respect to where it should be if it were in its ideal position. The ideal position is that position it would be in if no distortion had occurred. These measurements are made with a laser interferometer-based optical measuring tool designed for micro and macro-dimensional analysis of masks and reticles with a resolution, accuracy, and repeatability in the nanometer range. One suitable instrument for performing such measurements is sold by the Leica company under the designation LMS 2000.

The distance and direction between the measured position and the ideal position of each of the measured alignment marks, are determined. Once so determined a straight translation correction factor is established for each mark and applied to that mark. This correction factor is a vector of equal and opposite value to that of the determined vector and is applied to return each respective, measured alignment mark to as close to its ideal position as is possible.

These established translation factors now are applied, as a correction factor, to all the fields to correct for these translational errors by storing the calculations in the computer 21 that controls the electron beam controller 22.

Each field 30 also contains distortions resulting from rotation, magnification and non-orthogonality or skew. To correct for these distortions a number of fields 30a, (FIG. 3) say twenty-five fields out of a total number of about one thousand fields on the entire substrate, are selected at various positions across the entire substrate.

Once these fields are selected, the actual position of each of the L-shaped marks 32, in each selected field, is measured with respect to where it should be if it were in its ideal position. The ideal position is defined as that position it would be in if no distortion had occurred. These measurements are made with the same laser interferometer-based optical measuring tool designed for micro and macro-dimensional analysis of masks and reticles with a resolution, accuracy, and repeatability in the nanometer range described above and sold by the Leica company under the designation LMS 2000.

The distances and directions, i.e., the vectors, between the measured positions and the ideal positions are calculated and then the distributions of such measured positions relative to the ideal positions are determined by using the well known least-squares-fit method.

A correction factor is now determined. This requires that a figure be established from all the measurements from a selected field 30a for that selected field. The figures so established for all the measured fields are now averaged, to arrive at a single correction factor which is now applied to all the vectors in all the fields 30 to correct for the distortions due to magnification, rotation and skew. These distortions are corrected by storing in the computer 21 information that will cause the beam to move in a direction and in an amount as to compensate for the distortions represented by vectors for each field 30.

The electric and magnetic deflections are kept in calibration by a well-known automated measurement and correction procedure called LEARN. A calibration grid, made of intersecting metal bars, e.g., tungsten, gold or other heavy metal in a silicon substrate, is located on the X/Y stage. The intersecting tungsten bars are typically on an 18.75 μm periodicity. This periodicity is half the subfield periodicity of 37.5 μm. To determine the magnetic deflection position error, the bars are scanned at the center of each subfield (termed Center LEARN). If the subfield is properly positioned, the backscattered electron signal will be centered in the scan window. Any deviation from the center of the scan window is a magnetic deflection error. A table of corrections is derived from the errors and applied to the magnetic deflection in the error corrections system. Next the electric deflection error is determined. The bars are scanned at the corners of each subfield (termed Corner LEARN). From these errors a table of correction coefficients is calculated. These correct the electric deflection by correcting the spot placement on a spot-to-spot basis and are applied to the pattern data in the error correction system. Since the same bar is scanned from adjacent subfields, errors in subfield stitch are minimized. This procedure is completely automated. LEARN can be automatically invoked while writing a mask. The writing is stopped, the stage is moved to the calibration grid, a calibration collect is taken and analyzed. An update to the correction table is made if necessary and then the writing continues. At the present time the system stability is such that a LEARN calibration is performed only prior to writing, not during writing.

The tungsten and silicon calibration grid is fabricated using standard integrated circuit manufacturing techniques. However, this typically results in a grid that is not accurate enough to be used as a reference for advanced mask makers and the reference grid itself is preferably first calibrated with a well-known procedure called GRIDCAL.

The above electron beam lithography processes and calibration techniques are described in U.S. Pat. No. 5,424,548 to Puisto and in the articles "*Progress In E-Beam Mask Making For Optical And X-Ray Lithography*" by Hans C. Pfeiffer and Timothy R. Groves, Microelectronic Engineering 13(1991), pages 141–149; "*Electron Beam Lithography Tool For Manufacture of X-ray Masks*" by T. R. Groves, J. G. Hartley, H. C. Pfeiffer, D. Puisto and D. K. Bailey, IBM J. Res. Develop., Vol. 37, No. 3, May 3, 1993, pages 411–419; and "*Electron-Beam, X-Ray, EUV*", "*Ion-Beam Submicrometer Lithographies for Manufacturing V*", by James D. Rockroher et al; SPIE Vol. 2437 and "Automatic Registration is an Electron Beam Lithographic System" by D. E. Davis, R. D. Moore, M. C. Williams and O. C. Woodard, IBM J. Res. Develop. 11–77, November 1977, pages 498–505. The above references are incorporated herein by reference.

Bearing in mind the problems and deficiencies of the prior art, it is therefore an object of the present invention to provide improved calibration procedures in the electron beam lithography process and other electron beam processes to minimize electron beam errors when making masks or other articles.

It is a further object of the present invention to provide an apparatus to fabricate enhanced electron beam lithography masks and other products using improved electron beam calibration procedures.

Still other objects and advantages of the invention will in part be obvious and will in part be apparent from the specification.

SUMMARY OF THE INVENTION

The above and other objects, which are apparent to those skilled in the art, are achieved in the present invention which is directed in a first aspect to a method for improving the calibration techniques of electron beam lithographic processes broadly stated comprising performing the calibration procedures by scanning fields (typically rectangular) on calibration plates and grids based on the product pattern and preferably using the duty cycle of the mask or other product to be produced.

One calibration and performance test routine improves the so-called "REFP" test (REFP stands for REFerence Plate). One method of fabricating an X-ray mask type REFP uses a silicon, polyimide, chrome, gold, resist stack. The mask is a multilayer structure containing fields as shown in FIG. 3 and typically consisting of 3 µm Si, 1.7 µm polyimide, 0.005 µm Cr, 0.03 µm Au plating base, and 0.78 µm novolak resist. The resist is patterned using an E-beam tool, and electroplated with 0.65 µm Au, forming the gold pattern. Alternatively, a glass mask REFP may be fabricated starting with a glass, chrome and resist stack. The resist is E-beam exposed and developed, the exposed chrome is etched, leaving voids in the chrome which act as registration targets. The reference mask plate (X-ray or glass) is loaded into the system and is placed on the X/Y stage. The substrate contains registration marks preferably in the corners of each field, which are small bars in both X- and Y-coordinate directions, typically etched into a chrome layer on a (glass) or gold bars on an X-ray mask plate in evenly spaced intervals (in the order of mm). The electron beam is scanned across these marks, and the electrons backscattered from these lines are 'registered', i.e. collected by detectors, converted into electrical signals and processed by computer. The procedure therefore will be referred to as 'registration' and the beam is properly positioned in the field after registration. Since the distance between neighboring marks exceeds the size of the deflection field, to continue the calibration the plate is mechanically moved ('stepped') to place the next field under the undeflected beam. Other such reference plates and procedures may also be used.

Broadly stated, the calibration procedure used for the REFP routine improves the EMULATION procedure described above by generating a product pattern specific delta correction values to the corrections determined using only the EMULATION procedure. A reference plate having registration marks in the corner of each field is used and the method comprises a two-step calibration procedure of (1) field registration, replacing the usual exposure pattern and stepping sequence described above for the EMULATION procedure with the exposure pattern for the actual product pattern (B cycle) and the stage stepping sequence used for exposure of the product pattern and exposing the plate and, stepping the plate to the next field and repeating the above until all the fields are scanned and (2) the first field registration sequence is then repeated and then, instead of exposing the actual product pattern, an "L" pattern used to determine the base emulation of the EMULATION procedure will be exposed (B cycle) in each field and then the plate stepped using the stepping procedure of the product pattern and repeating the above until all the fields are scanned. Determining the errors based on the difference of linear term errors now obtained during the first registration with the product pattern and second registration with the "L"pattern is the measure of how much the product pattern changes the E-beam apparatus performance. The correction data obtained from the difference between the two registration cycles may then be applied to the correction factors determined in the EMULATION procedure and used to control the E-beam apparatus. It is preferred that additional information on linear term corrections be obtained by measuring the written product pattern with an external metrology tool such as described in U.S. Pat. No. 5,424,548 to Puisto, supra, for the purpose of correcting process distortions that occur after the mask leaves the E-beam apparatus.

The mechanics of the registration procedure and calculation of correction factors are described in "Automatic Registration in an Electron Beam Lithographic System", supra. Basically, at the four corners of the field, registration supplies 8 offsets (4X and 4Y) based on the X and Y deviations at each corner. The following formulas are used to calculate $\Delta X$ and $\Delta Y$.

$\Delta X = A + BX + CY + DXY;$ $\Delta Y = E + FX + GY + HXY;$ wherein

A and E are X and Y translation;

B and G are X and Y magnification;

C and F are rotation and orthogonality; and

D and H are trapezoid.

The eight corner offsets, together with the above equations, form a system of eight equations with eight unknowns, which are then solvable in a known manner to determine the A–H terms.

In the subject invention, two sets of A–H terms are determined based on the two B steps of the calibration procedure, supra. Thus, one set is determined when the actual product pattern is used and the other set when the "L" pattern is used. The EMULATION procedure produces a $(A_i, E_i)$ Base correction factor where i is the field exposed. In the improved method, the following formula is used to determine the improved correction factors for each field:

Improved Emulation=$(A_i, E_i)$ Base+$[(A_i \ldots H_i)_{step\ 1}$–$(A_i \ldots H_i)_{step\ 2}]$=$(A_i \ldots H_i)$ improved As each field it is exposed, the $(A_i \ldots H_i)$ improved correction factors are applied. Every spot is exposed at a location $X_n, Y_n$ within the field and the exposed position is modified by:

$\Delta X_n = A_i + B_i X_n + C_i Y_n = D_i X_n Y_n;$ $\Delta Y_n = E_i + F_i X_n + G_i Y_n + H_i X_n Y_n.$ The above procedure is used to calculate the correction factors as shown, for example, in step 168 of FIG. 7.

In order to further enhance the calibration procedure the REFP substrate used for these performance tests preferably has the same physical characteristics as the substrate used for product exposure, e.g., the same photoresist (and membrane structure in the case of an X-ray mask)is used for both the reference and product substrate.

In a further aspect of the invention, to compensate for the non-linear type errors (beam deflection calibration), the fixed (static) calibration pattern procedure using the LEARN process supra is replaced with a calibration method based on a dynamic pattern which closely emulates the product pattern in duty cycle and spatial charge density.

From the product pattern, information on the number of shapes and charge dose needed for each pattern segment (rectangle) within the deflection field for which an area calibration is performed is obtained. Using various known E-beam parameters, the exposure time for those areas can be calculated. If the product writing time is shorter than the standard calibration time using the fixed calibration LEARN method for all areas of the deflection field, restrict the number of calibration areas (rectangles) within the deflection field for calibration such as to substantially match the time during product exposure with the standard calibration time. Interpolate the calibration results for areas (deflection fields) not being calibrated. If the product writing time is longer than the static calibration time for all areas of the deflection field, increase the time being spent in each calibration area by increasing the number of rectangles in the field and adjust the number and size of the rectangles to achieve the desired time to significantly match the time during product exposure. It is also preferable to transfer to the grid the amount of charge of each calibration area within the deflection field to significantly match the product pattern. It is also preferable to coat the grid with a coating similar to the coating used on the product substrate.

The LEARN calibration procedure determines using the center LEARN procedure a trial set of subfield A and E corrections. The Corner LEARN procedure then scans the grid and computes subfield corrections in the same fashion as described above for the registration REFP procedure. It is important to appreciate that the E-beam errors are determined and the corrections applied at the subfield level as compared to the field level corrections of the EMULATION procedure.

The above procedure is used to calculate the corrections factors as shown in step 216 of FIG. 9

By incorporating the above modifications to the REFP plate and/or LEARN calibration procedures, a product specific calibration is performed which simulates very closely to the product pattern exposure, namely the time/temperature dependence of deflection devices. As the difference of time/temperature dependent errors between product pattern exposure and calibration is minimized this in turn minimizes the pattern dependent errors. Thus, the positional accuracy of an electron beam lithography machine improves considerably and the method of making a mask or other product is significantly enhanced.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(s)

Figure 1:
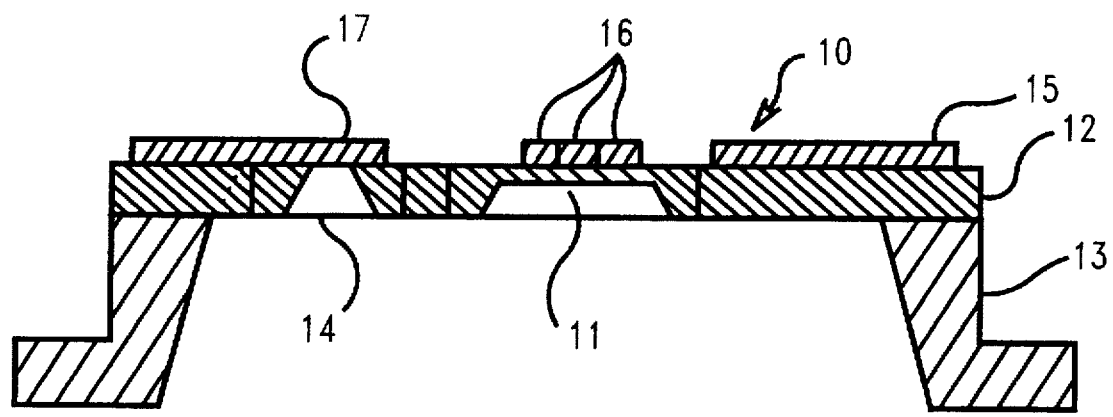
FIG. 1 is a cross-sectional view of an X-ray mask of the type which the present invention can benefit.

In describing the preferred embodiment of the present invention, reference will be made herein to FIGS. 1–10C of the drawings in which like numerals refer to like features of the invention. Features of the invention are not necessarily shown to scale in the drawings.

Figure 5:
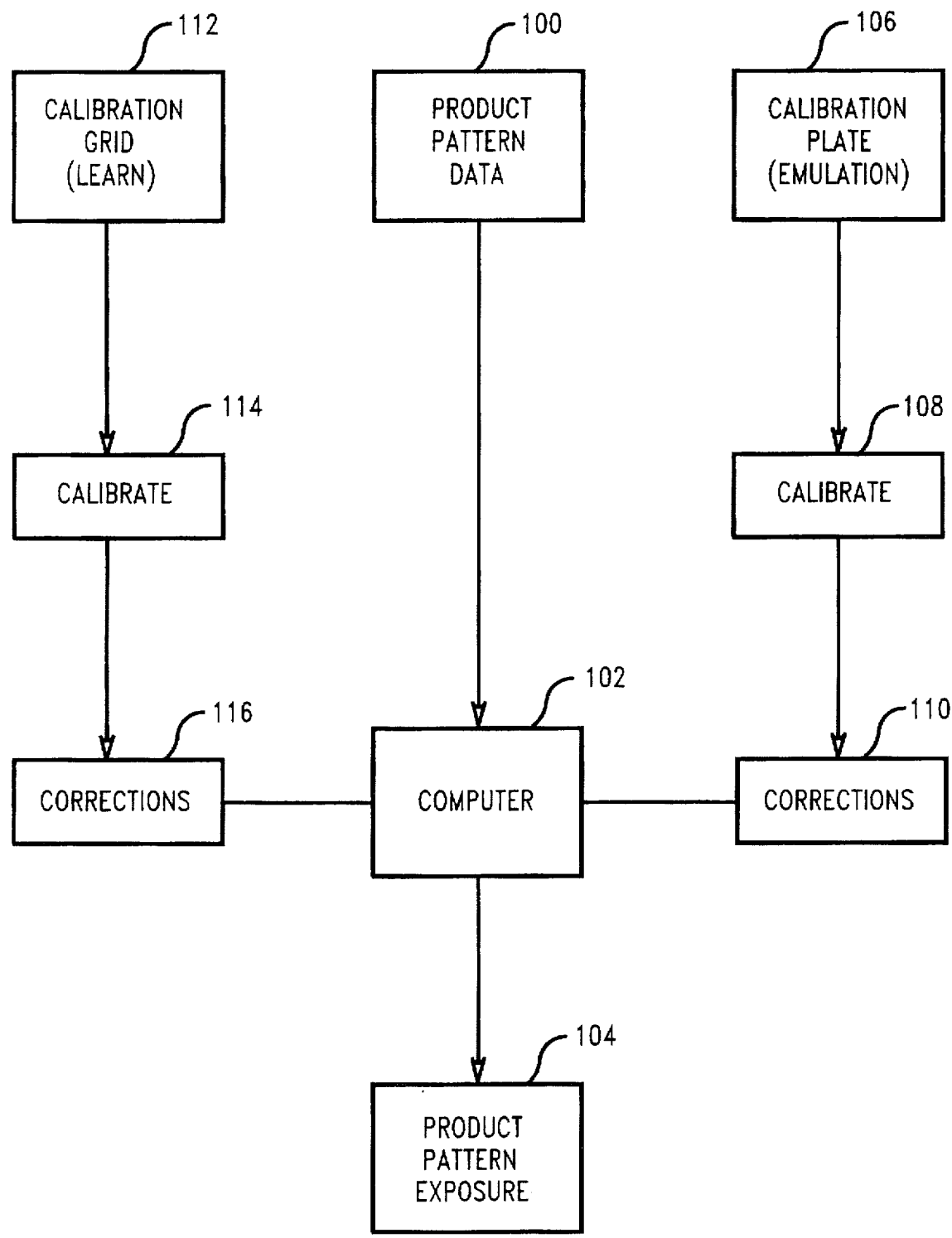
FIG. 5 is a block diagram showing how typical calibration procedures are used for correcting errors in the E-beam apparatus used in electron beam lithography.

Referring to FIG. 5 a block diagram showing the conventional method of calibrating an electron beam apparatus is shown and using the calibration corrections to control an E-beam apparatus for product pattern exposure. Pattern data in step 100 for the mask or other product to be made in the form of charge data, time, rectangles or other shapes is loaded into computer 102. A control plate is aligned on a stepping apparatus in step 106 as is well known in the art. In step 108, the E-beam apparatus is calibrated using a standard calibration technique as described above and the corrections calculated in step 110 are loaded into the computer 102. Likewise, a second calibration procedure (e.g., LEARN) using a grid mounted on the stepping apparatus in step 112. The E-beam apparatus is calibrated in step 114 and the corrections calculated in step 116 and loaded into the computer in step 102. The product pattern is exposed in step 104 to make the product.

Figure 4:
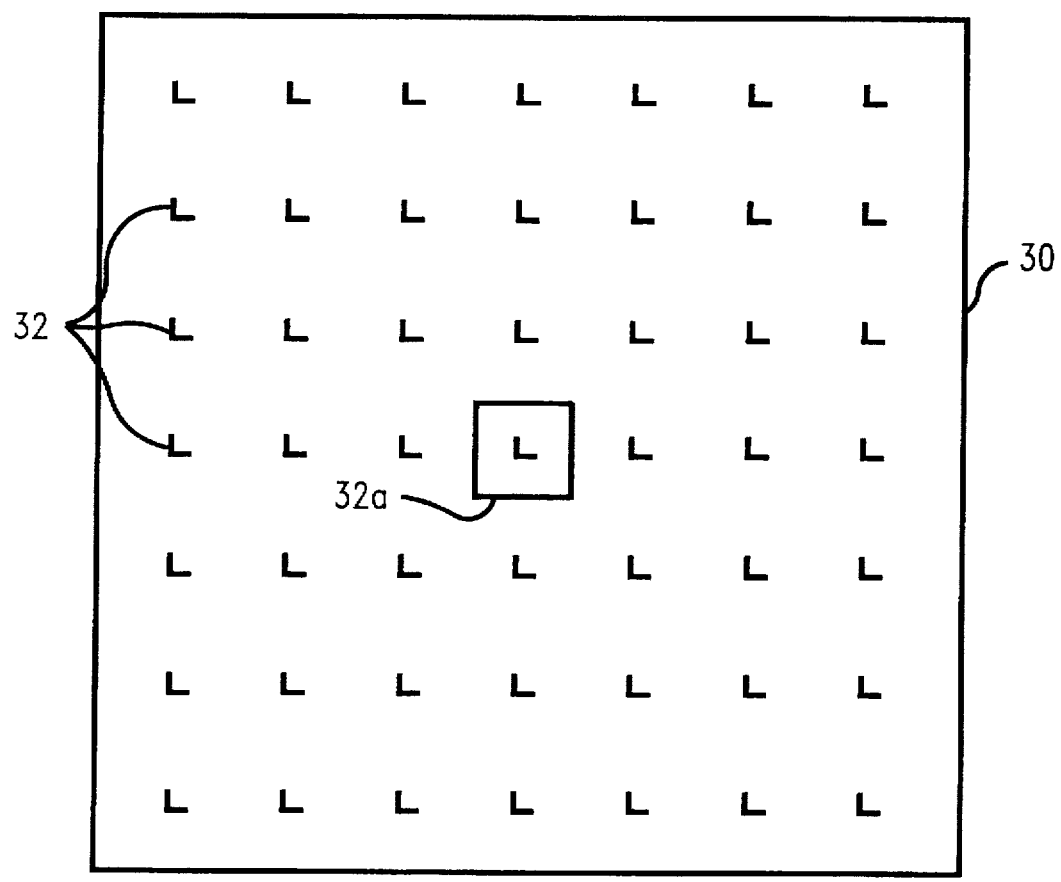
FIG. 4 illustrates an enlarged form of one of the fields of FIG. 3.
Figure 2:
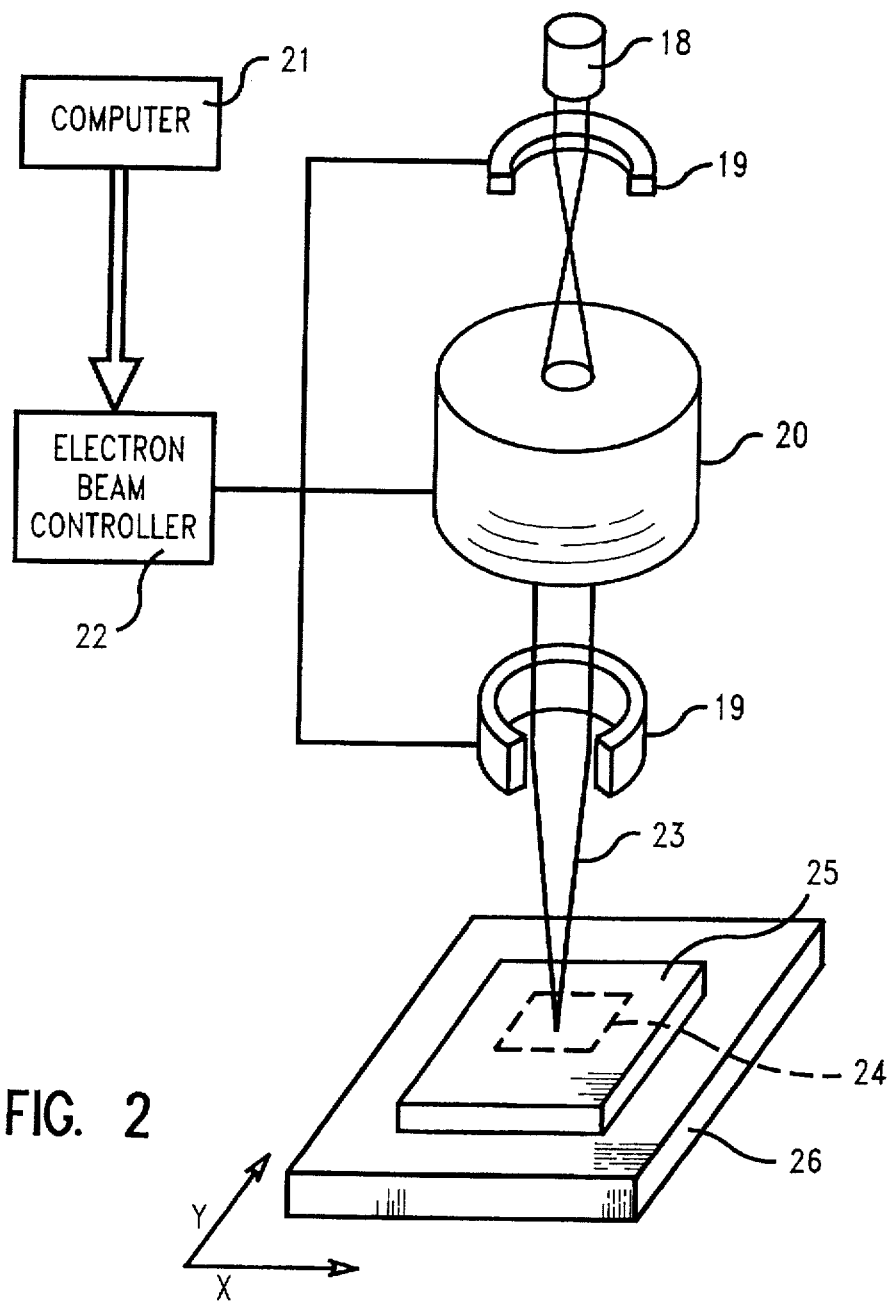
FIG. 2 schematically illustrates a computer controlled E-beam apparatus.
Figure 3:
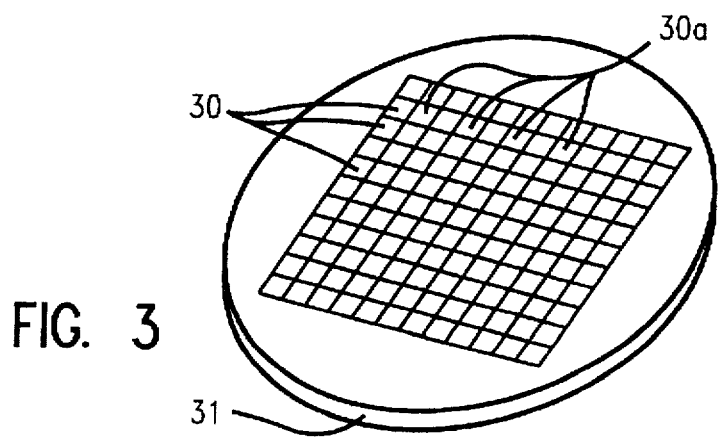
FIG. 3 illustrates a substrate covered with a photoresist and divided into a plurality of fields.
Figure 6:
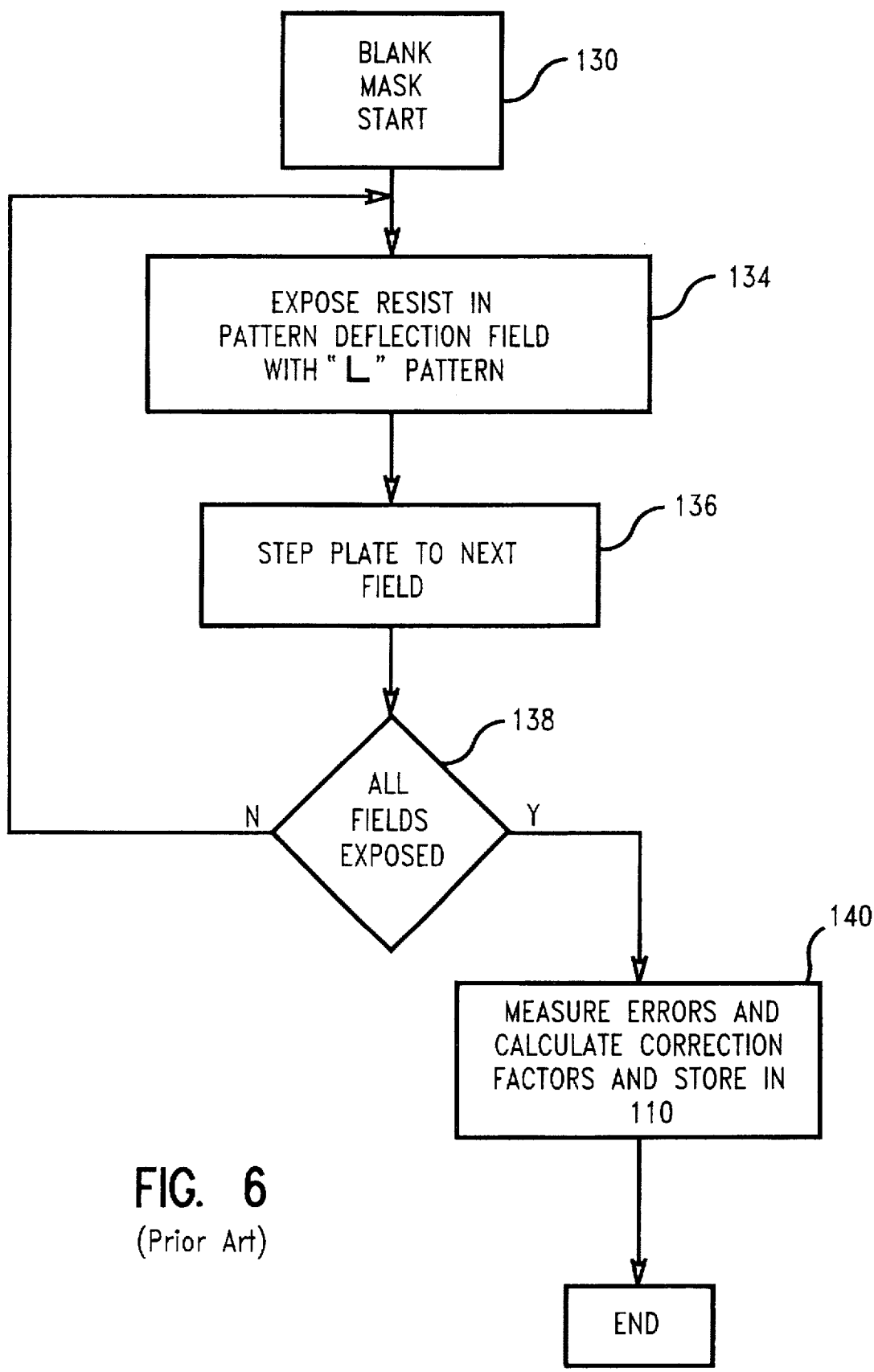
FIG. 6 is a block diagram showing the prior art EMULATION calibration procedure for correcting for stage X/Y errors in electron beam lithography.

In a conventional registration calibration test the apparatus is first calibrated for its stage stepping characteristics and for overall field distortions as shown in FIG. 6. This is accomplished by creating a plate in step 130 comprising a plurality of equally sized fields 30 on a photoresist coated sacrificial substrate or workpiece 31 as shown in FIG. 3. The selected pattern of L-shaped metrology marks 32 is then written across each field 30 in step 134 as shown in FIG. 4 which is an enlarged view of one such field 30. The plate is then stepped to the next field in step 136. Step 138 determines if all fields have been exposed. Once all the metrology marks are written into all the fields of the photoresist, the photoresist is developed and the actual positions of the central L-shaped image 32a, in each field, is measured in step 140 with respect to where it should be if it were in its ideal position. This information is used to create a master emulation table. The ideal position is that position it would be in if no distortion had occurred. These measurements are made with a laser interferometer-based optical measuring tool designed for micro and macro-dimensional analysis of masks and reticles with a resolution, accuracy, and repeatability in a nanometer range. One instrument for performing such measurements is sold by the Leica Company under the designation LMS 2000. The correction factors are calculated in step 140 as described above and stored in step 110. Additional correction factors are also calculated based on measuring twenty-five fields to measure each of the "L" shaped marks as described hereinabove (not shown in the flow chart of FIG. 6)

Figure 8:
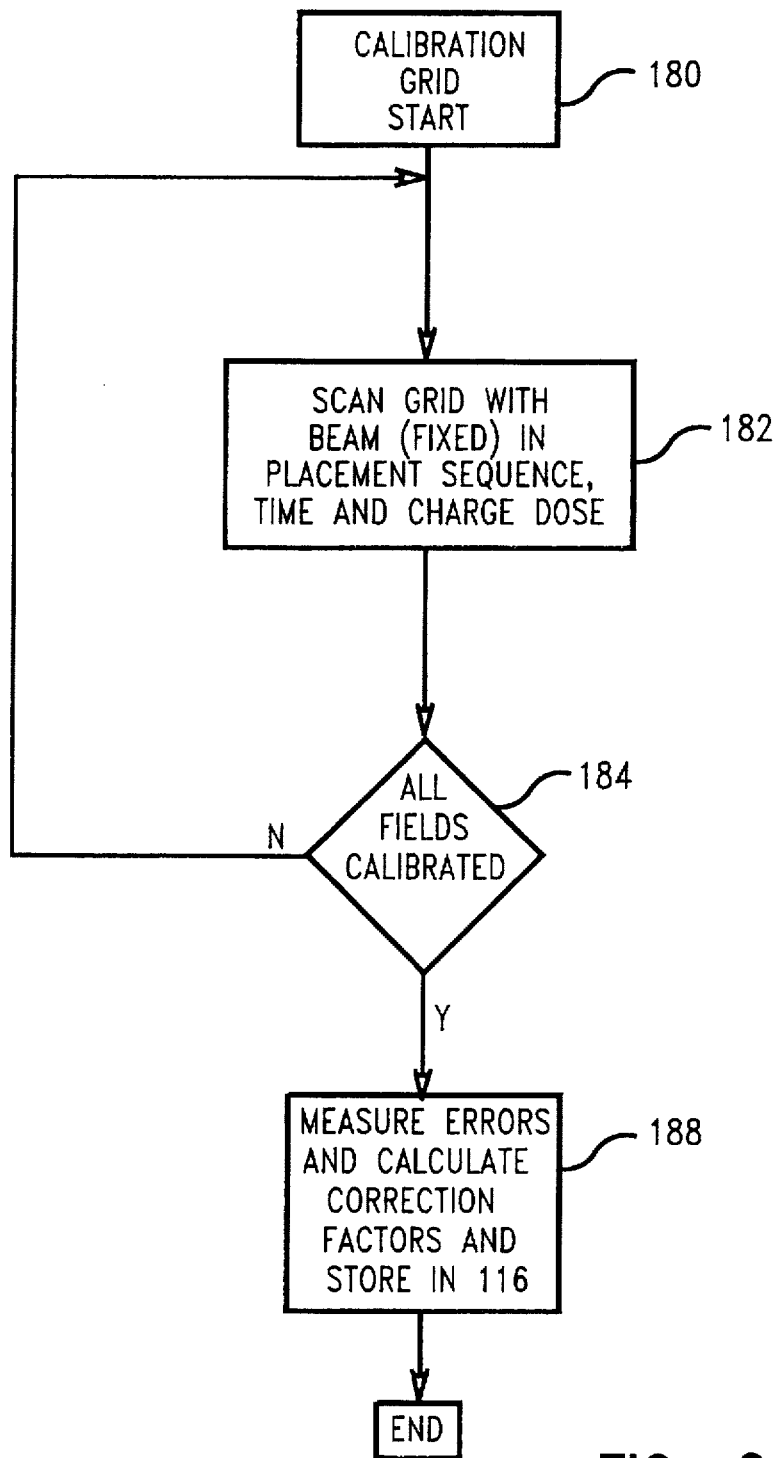
FIG. 8 is a block diagram showing the prior art LEARN calibration procedure for calculating corrections for beam deflection errors in electron beam lithography.

Similarly, a LEARN calibration pattern grid procedure as shown in FIG. 8, is mounted onto the X/Y stage in step 180 and the plate calibrated in step 182, using the LEARN procedures described above. The grid is scanned with a fixed placement sequence, time and charge dose in step 182. When the field has been scanned, step 184 tests for completion of the calibration. The LEARN grid is scanned at a single X/Y stage location. When all fields have been tested, the correction factors based on the errors are calculated in step 188 as described above and stored in step 116. The static calibration grid is the tungsten or silicon structure used in the LEARN procedure described above. Based on the measurements the corrections are calculated and stored in step 116 and the corrections are loaded into computer step 102 in FIG. 5. The computer then has the information of the product pattern data from step 100, and the correction data from steps 110 and 116 and controls the apparatus to expose the product pattern in step 104 on the mask substrate to make the desired mask.

Figure 7:
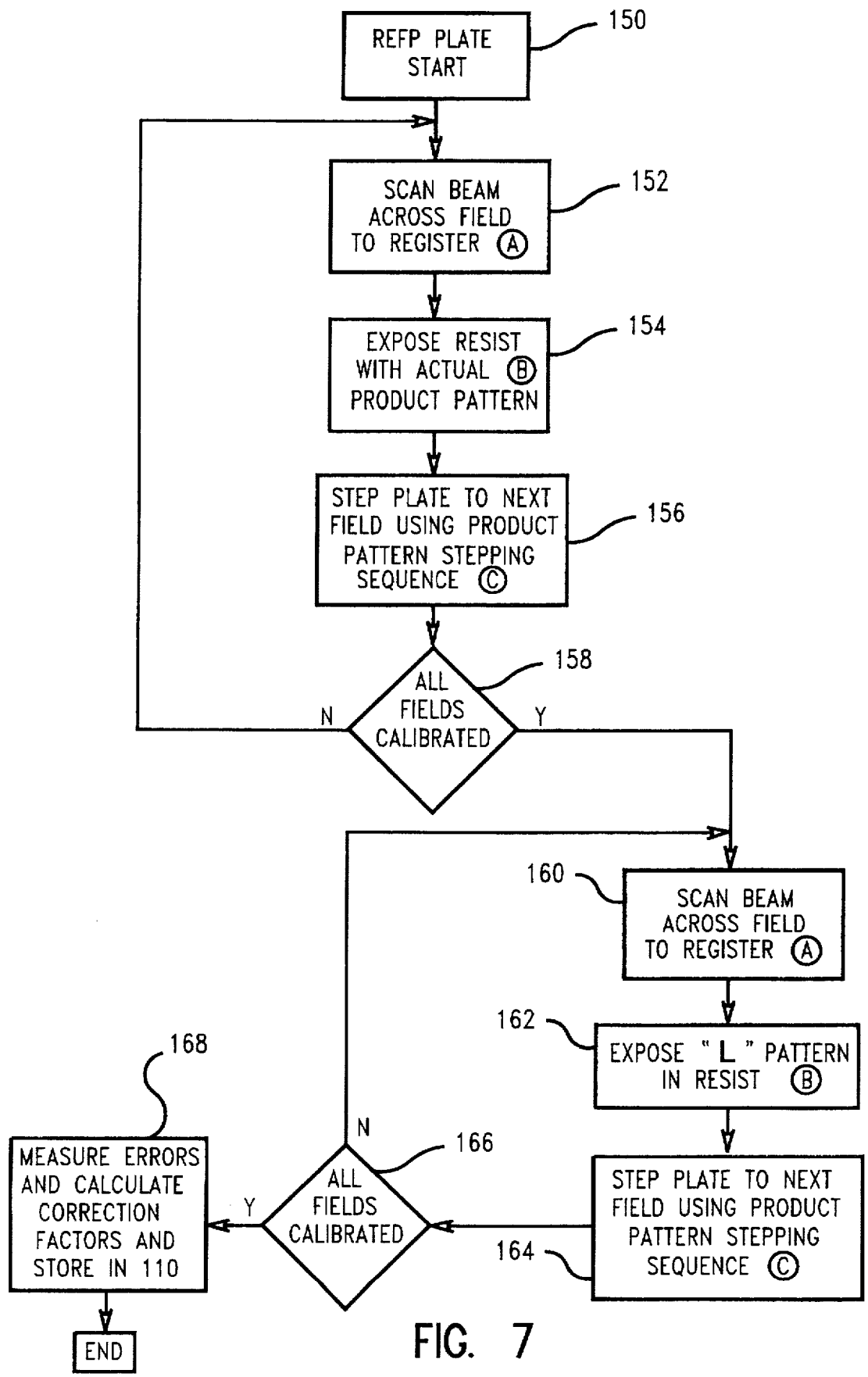
FIG. 7 is a block diagram showing an improved calibration procedure of the invention for correcting stage X/Y errors in electron beam lithography.

An improved method and apparatus of the invention is shown in block diagram in FIG. 7. Product pattern data in the form of rectangles or other shapes is loaded into step 150 and an REFP calibrated plate containing X and Y registration marks in the corners of each field is loaded onto an X/Y access stepping tool in step 150. The electron beam is scanned across these marks in step 152 and the electrons backscattered from these marks are registered, i.e., collected by detectors, converted into electrical signals and processed by the computer. This is termed an "A" cycle.

The tool then goes through a B pattern cycle in step 154 during which the radiation sensitive layer on the substrate (the resist) is exposed with the actual product pattern. After exposure, the plate is advanced (stepped) in step 156 to the next field during the C cycle. Step 158 determines when all the fields have been calibrated.

The calibration plate, is then scanned in step 160 (A cycle) and the plate exposed in step 162 with a standard "L" pattern design. The plate is then stepped in step 164 using the product pattern stepping sequence. After all the fields have been calibrated, the corrections generated from the calibration steps 152, 154 and 156; 160, 162 and 164 are calculated in step 168 as described above and stored in step 110. The corrections which are the difference of linear term errors during registration with the two step method using: 1) the product pattern and 2) the sparse "L" pattern is a measure of how much the product pattern changes the tool performance.

Figure 9:
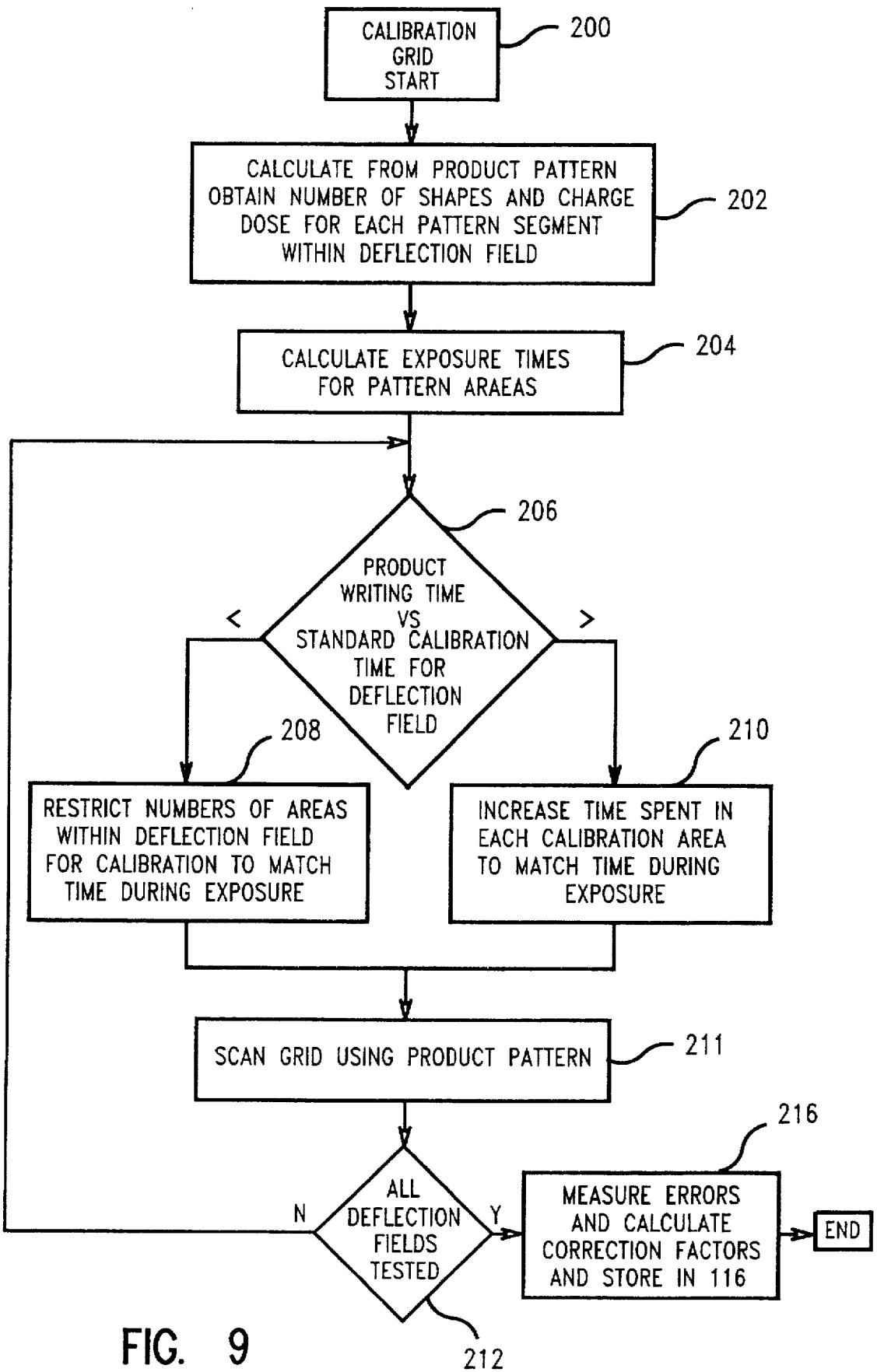
FIG. 9 is a block diagram showing an improved calibration procedure of the invention for correcting for beam deflection errors in electron beam lithography.
Figure 10:
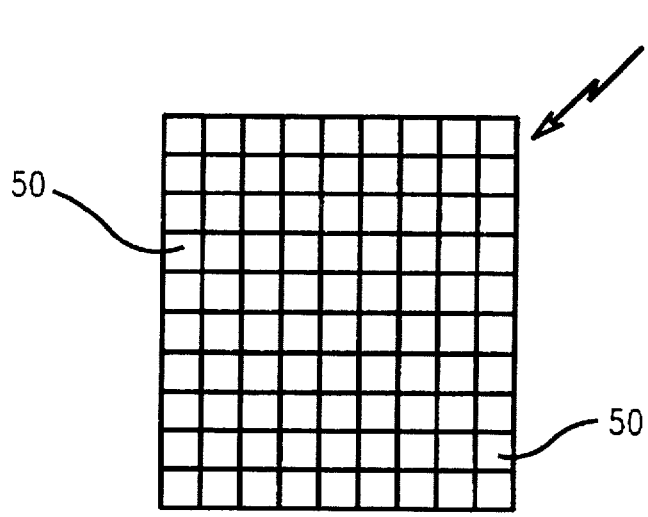
FIG. 10A illustrates a substrate field divided into subfields.
FIG. 10B illustrates the subfield of FIG. 10B containing pattern segments.
FIG. 10C illustrates a pattern segment of FIG. 10B.
Figure 10:
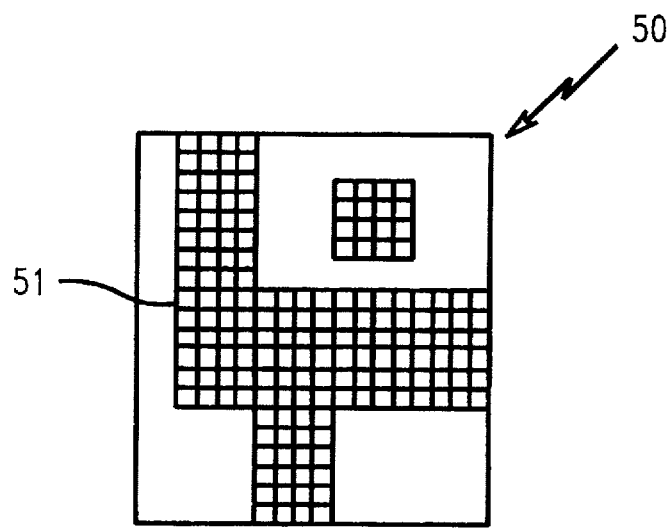
Figure 10:
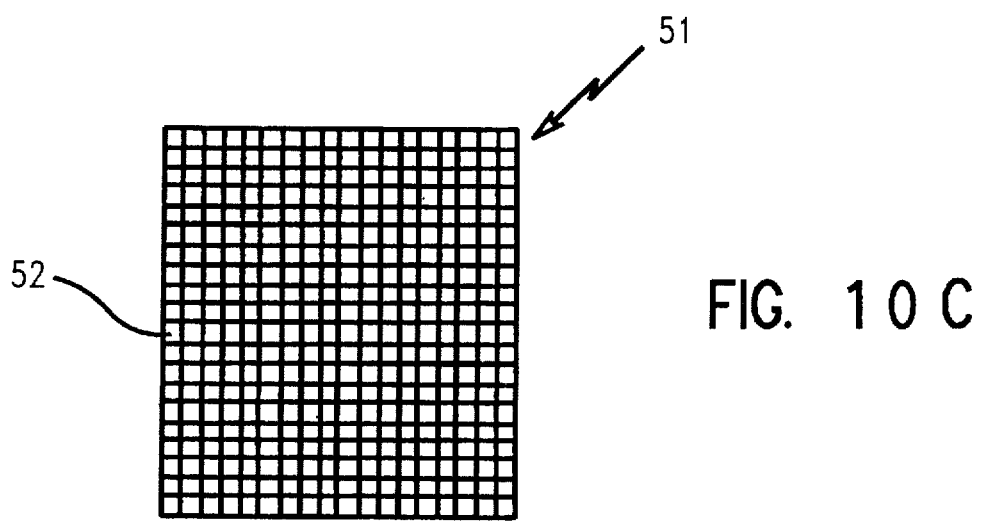

Likewise, in FIG. 9 the static test calibration grid coated with resist is loaded onto the X/Y stepping apparatus in step 200. Pattern data from step 202 is used to calculate in step 204 the exposure times for each of the fields (and subfields and rectangles) of the product pattern.

For a specific example of 4 rectangles per subfield and 550 exposure spots per rectangle, the following formulas may be used to calculate the exposure time and charge per subfield. Thus, $T_S = 3T_{RR} + 2199\ T_{SS} + 2200\ T_D$ and $Q_S = \rho \times 2200 T_D \times 8800\ A_S$.

wherein $T_S$=Total writing time in subfield;

$T_{RR}$=Rectangle to rectangle stepping time;

$T_{SS}$=Spot to spot stepping time;

$T_D$=Spot dwell time;

$Q_S$=Total charge applied to subfield (coulomb);

$A_S$=Spot size $(\mu m)^2$; and $\rho$=Current density coulomb/$(\mu m)^2$ sec.

It will be appreciated that the number of rectangles, number of spots per rectangle, spot size, current density, etc. can vary widely depending on desired operating conditions and calibration accuracy and that the above formulas will be adjusted accordingly.

The pattern exposure times are compared in step 206 with the standard calibration exposure times for the static test calibration method as described above. If the calculated pattern exposure time is greater than the standard calibration time used for the conventional test, dynamic calibration pattern data is generated in step 210 to substantially match the charge and exposure time parameters of the product pattern in all calibration areas. If the calculated pattern exposure time is smaller than the standard calibration time used for the conventional test, dynamic calibration pattern data is generated in step 208 for a restricted number of calibration areas to match the product writing time and charge parameters. Calibration results for areas not being calibrated are obtained by interpolation. The grid is scanned in step 211 and after all the fields are calibrated as determined by step 212, the errors and correction factors are calculated in step 216 as described above and are stored in step 116. The computer as shown in FIG. 5, based on the product pattern data of step 100 and correction data of steps 110 and 116 based on calibration tests of the invention performed using product pattern data is used by computer 102 in step 104 to expose the product pattern on the substrate and make the mask product.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for correcting for electron-beam apparatus errors by improving the process used to calibrate an electron-beam apparatus which apparatus is used to make product pattern masks comprising:

preparing a first calibration plate having a number of fields on a substrate with registration marks in each field;

mounting the first calibration plate on an X/Y stepping fixture;

registering the first calibration plate by scanning the electron beam across the field;

exposing the plate with the product pattern;

stepping the plate to the next field using the sequence for exposure of the product pattern;

repeating the above procedure for all the fields of the product pattern;

registering the first calibration plate by scanning the electron beam across the field;

exposing the plate with an L pattern using the stepping procedure of the product pattern;

stepping the plate to the next field using the product pattern stepping sequence;

repeating the above for all the fields of the product pattern;

measuring the errors for each registration procedure;

determining first calibration plate correction errors based on the measured errors of the first calibration plate;

storing the correction data generated by calibration of the first calibration plate;

preparing a second calibration grid having fields and subfields defined by metal lines on a silicon substrate in the form of a grid;

mounting the grid on an X/Y stepping fixture;

calculating product pattern data for subfields of the grid based on the product pattern;

calculating subfield exposure times based on the product pattern;

comparing the product writing time and the standard calibration time subfield by subfield;

adjusting the exposure time for each subfield to correspond to the product exposure time for that subfield;

exposing the grid using the same exposure times as for the product pattern;

measuring the errors for each subfield;

determining if all the product pattern fields have been tested;

determining second correction errors based on the measured errors of the second calibration grid;

storing the second calibration grid correction data; and creating a mask based on the product pattern and first and second correction error data.

2. The method of claim 1 wherein the first calibration plate is made using the same photoresist as the mask to be fabricated.

3. The method of claim 2 wherein the second calibration grid comprises intersecting metal lines.

4. The method of claim 3 wherein the grid has the same resist coating as the mask to be fabricated.

5. The method of claim 3 wherein the metal lines are tungsten, gold or other heavy metal.

6. An apparatus for electron beam lithography processes to make masks comprising:

a source of a working energy beam;

an X-Y stepping mechanism;

a first calibration plate loadable onto the X-Y stepping mechanism the plate comprising fields, each of which field having registration marks in each field;

a second calibration grid comprising intersecting metal lines loadable onto the X-Y stepping mechanism;

means for determining correction errors from the first calibration plate comprising using a two-step registration procedure wherein after registration of each field the first plate is exposed using the product pattern and stepping sequence used to make the mask and after all the fields have been tested is again registered in each field and each field of the plate is then exposed to form L shaped marks in the plate using the stepping sequence of the product mask and then the errors of each registration procedure are measured and the first correction errors calculated;

means for determining correction errors from the second calibration grid comprising calculating the exposure times for each subfield based on the product pattern and comprising comparing the calculated product writing time with a standard calibration time and adding or deleting exposure rectangles within each field of the grid to significantly match the exposure time for calibration with the exposure time for the product pattern;

means for measuring the error for each subfield;

determining the second correction errors for the second calibration grid;

using the first and second correction errors to control the apparatus to expose the product pattern in the mask substrate to form the mask.

7. The apparatus of claim 6 wherein the first calibration plate is made using the same photoresist as the mask to be fabricated.

8. The apparatus of claim 7 wherein the metal lines of the second calibration grid are tungsten.

9. The apparatus of claim 8 wherein the grid has the same resist coating as the mask to be fabricated.

10. The apparatus of claim 6 wherein the metal lines are tungsten, gold or other heavy metal.

11. A method for correcting for electron-beam apparatus errors by improving the process used to calibrate an electron-beam apparatus which apparatus is used to make product pattern masks comprising:

preparing a calibration plate having a number of fields on a substrate with registration marks in each field;

mounting the calibration plate on an X/Y stepping fixture;

registering the calibration plate by scanning the electron beam across the field;

exposing the plate with the product pattern;

stepping the plate to the next field using the sequence for exposure of the product pattern;

repeating the above procedure for all the fields of the product pattern;

registering using the calibration plate by scanning the electron beam across the field;

exposing the plate with an L pattern using the stepping procedure of the product pattern;

stepping the plate to the next field using the product pattern stepping sequence;

repeating the above for all the fields of the product pattern;

means for measuring the errors from each registration procedure;

determining calibration plate correction errors based on the measured errors of the calibration plate;

storing the correction data generated by calibration of the calibration plate; and creating a mask based on the product pattern and correction error data.

12. The method of claim 11 wherein the calibration plate is made using the same photoresist as the mask to be fabricated.

13. A method for correcting for electron-beam apparatus errors by improving the process used to calibrate an electron-beam apparatus which apparatus is used to make product pattern masks comprising:

preparing a calibration grid having fields and subfields defined by metal lines on a silicon substrate in the form of a grid;

mounting the grid on an X/Y stepping fixture;

calculating product pattern data for subfields of the grid based on the product pattern;

calculating subfield exposure times based on the product pattern;

comparing the product writing time and the standard calibration time subfield by subfield;

adjusting the exposure time for each subfield to correspond to the product exposure time for that subfield;

exposing the grid using the same exposure times as for the product pattern;

measuring the errors for each subfield;

determining if all the product pattern fields have been tested;

determining correction errors based on the measured errors of the calibration grid; and creating a mask based on the product pattern and correction error data.

14. The method of claim 13 wherein the metal lines of the calibration grid are tungsten.

15. The method of claim 14 wherein the grid has the same resist coating as the mask to be fabricated.

16. The method of claim 13 wherein the metal lines are tungsten, gold or other heavy metal.

17. an apparatus for electron beam lithography processes to make masks comprising:

a source of a working energy beam;

an X-Y stepping mechanism;

a calibration plate loadable onto the X-Y stepping mechanism the plate comprising fields having registration masks in each of the fields;

means for determining correction errors from the calibration plate comprising using a two-step registration procedure wherein after registration of each field the plate is exposed using the product pattern and stepping sequence used to make the mask and after all the fields have been tested is again registered in each field and each field of the plate is then exposed to form L shaped marks in the plate using the stepping sequence of the product mask and then the errors of each registration procedure are measured and the correction errors calculated;

using the correction errors to control the apparatus to expose the product pattern in the mask substrate to form the mask.

18. The apparatus of claim 17 wherein the calibration plate is made using the same photoresist as the mask to be fabricated.

19. An apparatus for electron beam lithography processes to make masks comprising:

a source of a working energy beam;

an X-Y stepping mechanism;

a calibration plate comprising intersecting metal lines loadable onto the X-Y stepping mechanism;

means for determining correction errors from the calibration grid comprising calculating the exposure times for each subfield based on the product pattern and comprising comparing the calculated product writing time with a standard calibration time and adding or deleting exposure rectangles within each subfield of the grid to significantly match the exposure time for calibration with the exposure time for the product pattern;

means for measuring the error for each subfield;

determining the correction errors for the calibration grid;

using the correction errors to control the apparatus to expose the product pattern in the mask substrate to form the mask.

20. The apparatus of claim 19 wherein the grid has the same resist coating as the mask to be fabricated.

21. The apparatus of claim 19 wherein the metal lines are tungsten, gold or other heavy metal.

* * * * *